United States Patent
Zang et al.

(10) Patent No.: US 9,620,425 B1
(45) Date of Patent: Apr. 11, 2017

(54) METHOD OF ADJUSTING SPACER THICKNESS TO PROVIDE VARIABLE THRESHOLD VOLTAGES IN FINFETS

(71) Applicant: GLOBALFOUNDRIES Inc., Grand Cayman (KY)

(72) Inventors: Hui Zang, Guilderland, NY (US); Min-hwa Chi, San Jose, CA (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/156,822

(22) Filed: May 17, 2016

(51) Int. Cl.
- H01L 21/8234 (2006.01)
- H01L 21/84 (2006.01)
- H01L 29/423 (2006.01)
- H01L 29/49 (2006.01)

(52) U.S. Cl.
CPC ........ H01L 21/845 (2013.01); H01L 29/4236 (2013.01); H01L 29/4966 (2013.01)

(58) Field of Classification Search
CPC ............ H01L 29/66795; H01L 29/785; H01L 27/0924; H01L 21/845; H01L 29/4236; H01L 29/4966
USPC ........ 438/197, 595, 275, 156; 257/401, 407, 257/390
See application file for complete search history.

(56) References Cited

U.S. PATENT DOCUMENTS

| | | | |
|---|---|---|---|
| 2015/0037945 A1* | 2/2015 | van Meer | H01L 21/823807 438/199 |
| 2015/0145064 A1* | 5/2015 | Ramachandran | H01L 29/785 257/401 |

OTHER PUBLICATIONS

M. Kadoshima et al., "Effective-Work-Function Control by Varying the TiN Thickness in Poly-Si/TiN Gate Electrodes for Scaled High-k CMOSFETs", IEEE EDL, vol. 30, No. 5, pp. 466-468, Mar. 31, 2009.
N. Inoue et al., "UV Cure Impact on Robust Low-k with Sub-nm Pores and High Carbon Content for High Performance Cu/Low-k BEOL Modules", IEEE, IITC, 2013.
U.S. Appl. No. 15/156,767, filed May 17, 2016, titled Apparatus and Method of Adjusting Work-Function Metal Thickness to Provide Variable Threshold Voltages in FinFETs.

* cited by examiner

Primary Examiner — Julia Slutsker
(74) Attorney, Agent, or Firm — Heslin Rothenberg Farley & Mesiti P.C.

(57) ABSTRACT

A method of adjusting work-function metal thickness includes providing a semiconductor structure having a substrate, the substrate including a first array of fins formed thereon. First spacers are formed having a first spacer thickness on sidewalls of fins of the first array. The thickness of the first spacers is adjusted to provide a second spacer thickness different from the first spacer thickness. First supports are formed between and adjacent the first spacers. The first spacers are removed to form first WF metal trenches defined by the fins of the first array and the first supports. A gate is formed extending laterally across the fins of the first array. First WF metal structures are disposed within the first WF metal trenches within the gate.

20 Claims, 16 Drawing Sheets

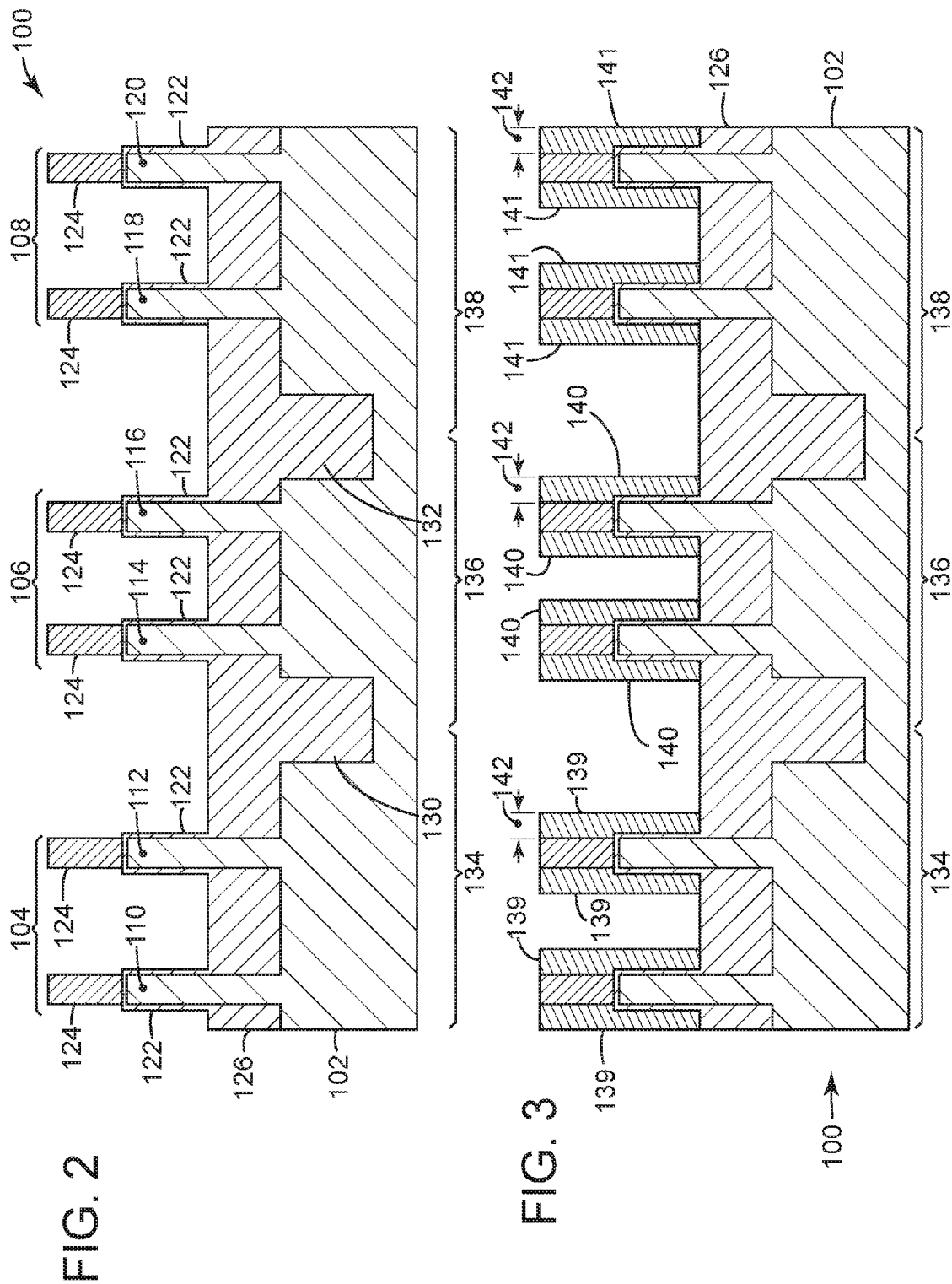

METHOD OF ADJUSTING SPACER THICKNESS TO PROVIDE VARIABLE THRESHOLD VOLTAGES IN FINFETS

TECHNICAL FIELD

The present invention relates to semiconductor devices and methods of fabricating the same. More specifically, the invention relates to an apparatus and method of adjusting work-function metal thicknesses to provide variable threshold voltages for FinFETs.

BACKGROUND

With constant down-scaling and increasingly demanding requirements to the speed, and functionality of advanced Fin Field Effect Transistor (FinFET) technology, there is a growing need for integrated circuits having FinFETs with multiple threshold voltages (Vt) and methods of making the same. This is particularly the case for smaller scale integrated circuits, such as the 14 nanometer (nm) class and beyond.

A typical prior art method of implementing a multiple Vt design for an integrated circuit has been through the implementation of dopants in the channel or fins of the FinFETs. However, such implantation methods lead to high defect density (due to added implanting, etching and the like) and degraded yield.

Another prior art method of making a multiple Vt integrated circuit has been by adjusting the work-function (WF) metal thickness in gates of FinFETs. Typically however, such methods include multiple depositions and removals of WF metal over the high-k dielectric in a gate stack within a FinFET semiconductor region. For example, a first layer of WF metal having a first thickness may be disposed over the high-k dielectrics in the gate stacks of an entire semiconductor region. A first portion of the region may then be masked or blocked off. The first layer of WF metal in a second unmasked portion of the region is then removed by such means as wet etching, dry etching or a suitable combination of both, leaving the dielectric in the second portion exposed again. The mask is then removed from the first portion. A second layer of WF metal having a second thickness is then disposed over the entire region. The result is that the first portion of the semiconductor region has a total WF metal thickness of the combined thicknesses of the first and second WF metal layers, while the second portion of the semiconductor region has a total WF metal thickness of just the second WF metal thickness. Each WF metal thickness will correspond to a different Vt. This process can continue to provide multiple WF metal thicknesses and multiple threshold voltages for multiple portions of a semiconductor region.

Problematically however, such prior art method of adjusting the WF metal requires multiple depositions and removals of the WF metal, which can greatly increase the likelihood of damaging the thin high-k dielectric and WF layers previously formed. Also it increases the possibility of defects in the gate structure due to repeated exposure of the dielectric to etching and other processes.

Accordingly, there is a need for an apparatus and method of implementing a multi-Vt design in an integrated circuit that does not increase the possibility of damaging the channel, fins or gate areas. More specifically, there is a need for an apparatus and method of adjusting the Vt through variations in thicknesses of WF metal in a FinFET integrated circuit that does not involve multiple depositions and removals of the WF metal.

BRIEF DESCRIPTION

The present invention offers advantages and alternatives over the prior art by providing an apparatus and method of adjusting work-function metal thickness to provide variable threshold voltages for FinFETs. The methods involve adjustments of work-function thicknesses in ways that do not involve multiple depositions and removals of the work-function metal.

A method in accordance with one or more aspects of the present invention includes providing a semiconductor structure having a substrate, the substrate including a first array of fins formed thereon. First spacers are formed having a first spacer thickness on sidewalls of fins of the first array. The thickness of the first spacers is adjusted to provide a second spacer thickness different from the first spacer thickness. First supports are formed between and adjacent the first spacers. The first spacers are removed to form first WF metal trenches defined by the fins of the first array and the first supports. A gate is formed extending laterally across the fins of the first array. First WF metal structures are disposed within the first WF metal trenches within the gate.

In another aspect of the invention a method includes providing a structure having a substrate, the substrate including longitudinally extending first and second arrays of fins overlaying first and second electrically isolated regions of the substrate respectively. First and second spacers, each having a substantially equal first spacer thickness, are formed on sidewalls of fins of the first and second arrays respectively. The thickness of the first spacers are adjusted to provide a second spacer thickness different from the first spacer thickness, First and second supports are formed between and adjacent the first and second spacers respectively, The first and second spacers are removed to form first and second WF metal trenches respectively. A gate is formed extending across the fins of the first and second arrays. First and second WF metal structures are disposed within the first and second WF metal trenches respectively within the gate.

DRAWINGS

The invention will be more fully understood from the following detailed description taken in conjunction with the accompanying drawings, in which:

FIG. 2 is a cross-sectional view of FIG. 1 taken along the line 2-2 with an oxide layer grown on sidewalls of first, second and third electrically isolated arrays of fins of the structure in accordance with the present invention;

FIG. 3 is a cross-sectional view of FIG. 2 with first, second and third spacers formed on sidewalls of the first, second and third arrays of fins respectively in accordance with the present invention;

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-16 illustrate various exemplary embodiments of an apparatus and method of forming an integrated circuit structure 100 having variable threshold voltages (Vts). The Vts are provided by adjusting work-function (WF) metal thickness within the gate stacks of FinFETs in accordance with the present invention.

Figure 1:
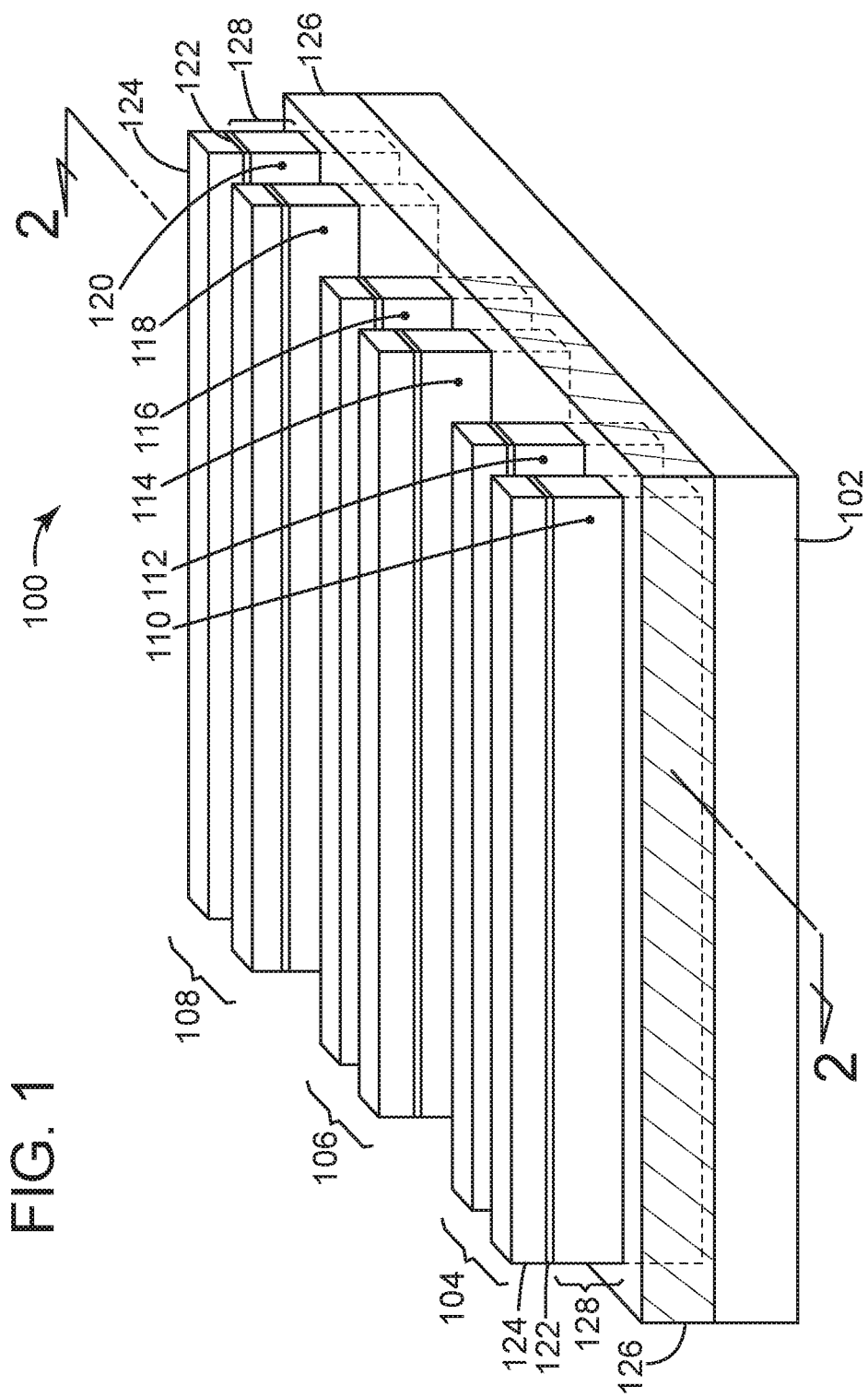
FIG. 1 is a simplified perspective view of an exemplary embodiment of a variable Vt semiconductor structure 100 for an integrated circuit device at an intermediate stage of manufacturing in accordance with the present invention.

Referring to FIG. 1, a simplified perspective view of an exemplary embodiment of a variable Vt semiconductor structure 100 for an integrated circuit device in accordance with the present invention is presented at an intermediate stage of manufacturing. Structure 100 includes a substrate 102 having first, second and third arrays of fins 104, 106 and 108 (i.e., 104-108) respectively. The first fin array 104 includes fins 110 and 112, the second fin array 106 includes fins 114 and 116, while the third fin array 108 includes fins 118 and 120. Fins 110, 112, 114, 116, 118 and 120 (i.e., 110-120), which were formed by well-known methods, extend laterally across the substrate 102. The fins 110-120 may be n-type fins, p-type fins or a combination of both. Though six fins are illustrated for this embodiment, any number of fins grouped in any number of arrays may be included in the substrate 102.

Disposed over each top surface of the fins 110-120 is a protective thin (typically approximately 1-2 nm) oxide layer 122. Oxide layer 122 may be formed by thermally oxidizing the exposed surface of substrate 102 prior to fin formation, or may be deposited onto the substrate 102 using, for example, chemical vapor deposition (CVD) or atomic layer deposition (ALD).

A first hardmask layer 124 is disposed over the oxide layer 122 of each fin 110-120. Hardmask layer 124 was originally used to protect and define the fins 110-120 during the formation process. The first hardmask 124 may be composed of a titanium nitride (TiN) or similar.

A flowable oxide (FOX) layer 126 was initially disposed over the fins 110-120 and planarized using such methods as chemical-mechanical polishing (CMP) to expose the first hardmask layer 124 disposed on the tops of the fins. The FOX layer 126 was then recessed using standard lithographic and etching processes that are well-known. The exposed portion of the fins 110-120, which extend above the recessed FOX layer 120, now define an active height 128 of the fins.

Referring to FIG. 2, a cross-sectional side view of FIG. 1 taken along lines 2-2 is illustrated. In FIG. 2 the oxide layer 122 is next grown on the sidewalls of fins 110-120 to conformally coat the fins. From this view, it can be seen that shallow trench isolation (STI) trenches 130 and 132 have been etched into substrate 102 to divide structure 100 into first, second and third distinct electrically isolated regions 134, 136 and 138 respectively. The first region 134 includes first fin array 104, the second region 136 includes second fin array 106, and the third region includes third fin array 108. Though three regions 134-138 are illustrated for this embodiment, any number of regions may be included in the substrate 102.

As will be explained in greater detail herein, each array 104-108 will be designed for FinFET devices having a unique threshold voltage (Vt) associate with that array and different from the other arrays. The Vts associated with each array will vary depending upon the various thicknesses of the work-function metal structures in the gate stacks of the FinFET devices.

Referring to FIG. 3, next first, second and third spacers 139, 140 and 141 respectively, each having a uniform first spacer thickness 142, are formed on the sidewalls of the fins 110-120. The first spacers 139 overlay the first electrically isolated region 134, the second spacers 140 overlay the second region 136 and the third spacers 141 overlay the third region 136. Spacers 139, 140 and 141 (herein 139-141) are formed by first disposing a conformal layer (not shown) of spacer material having the uniform first spacer thickness 142 over the fins 110-120 and then anisotropically etching the spacer layer to form the spacers 139-141. The spacers 139-141 may be composed of an amorphous silicon (a-Si) or similar poly-silicon material.

The uniform first spacer thickness 142 of spacers 139-141 can typically range from 3 to 10 nanometers (nm). As will be explained in greater detail herein, the first thickness 142 of the spacers 139-141 will be adjusted in each of the three electrically isolated regions 134, 136 and 138. The spacers 139-141 will then be utilized to form WF metal structures 192, 194 and 196 (best seen in FIG. 16) having variable thicknesses to provide variable threshold voltages (Vt) in each of the three regions 132, 134 and 136.

Figure 4:
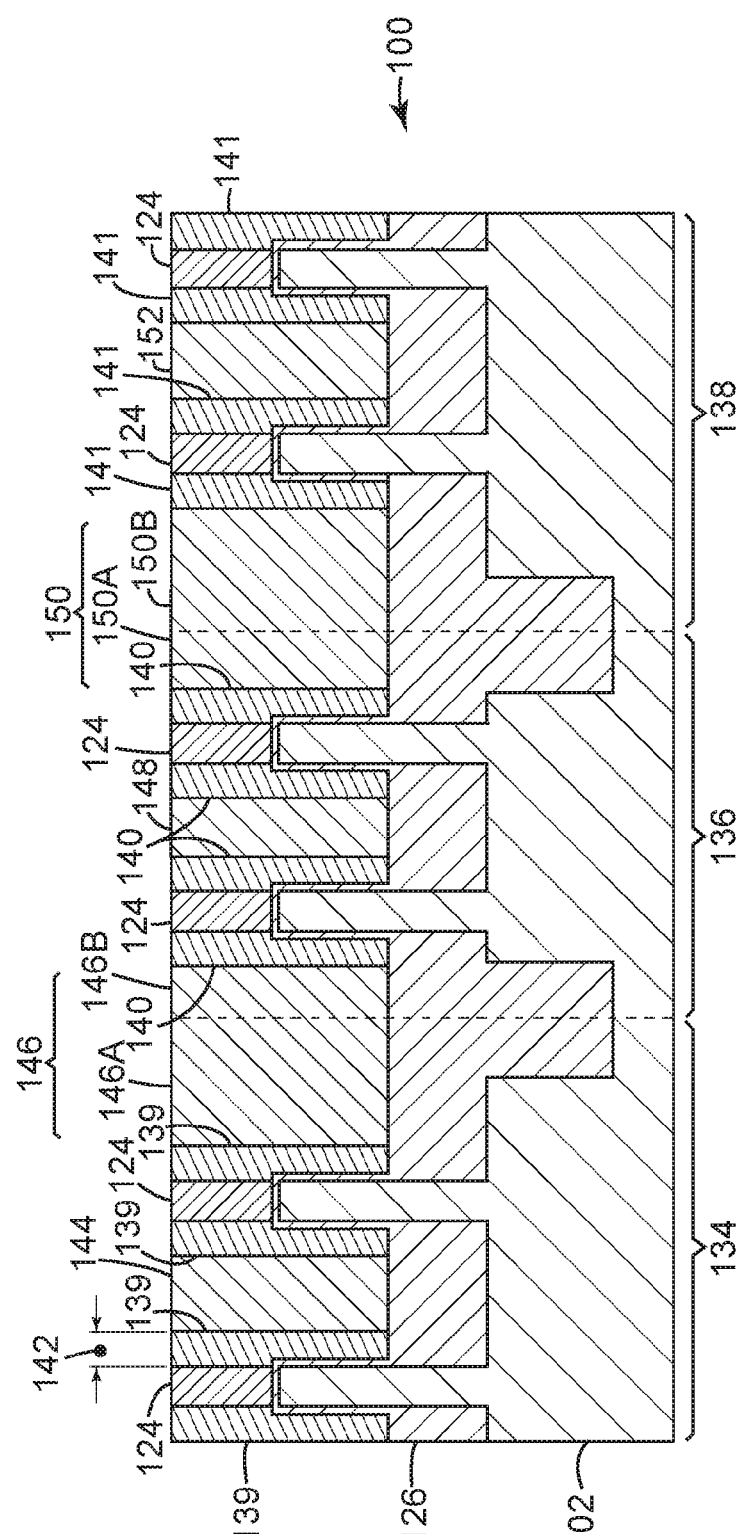
FIG. 4 is a cross-sectional view of FIG. 3 with pillars disposed between and adjacent the spacers in accordance with the present invention.

Referring to FIG. 4, pillars 144, 146, 148, 150 and 152 (i.e., 144-152) are then disposed between and adjacent the sidewalls of the spacers 139-141. Pillars 144-152 are formed by first disposing a pillar layer (not shown) of pillar material over the entire structure 100, including the areas between the spacers 139-141. The pillar layer is then planarized down by such processes as chemical-mechanical polishing (CMP) or similar to expose, again, top surfaces of the hardmask layer 124 and to finalize formation of pillars 144-152. The pillars 144-152 may be formed of an amorphous carbon (a-C), an organic silicon (a-Si), an organic planarizing layer (OPL) or similar.

The pillars 144-152 overlay all three electrically isolated regions 134, 136 and 138. Those pillars that overlay the first region 134 are called, collectively, the "first pillars", which herein include pillar 144 and a portion of pillar 146 (designated herein as 146A). Those pillars that overlay the second region 136 are called, collectively, the "second pillars", which herein include the remaining portion of pillar 146 (designated herein as 146B), pillar 148 and a portion of pillar 150 (designated herein as 150A). Those pillars that overlay the third region 138 are called, collectively, the "third pillars", which herein include the remaining portion of pillar 150 (designated herein as 150B) and pillar 152.

Figure 5:
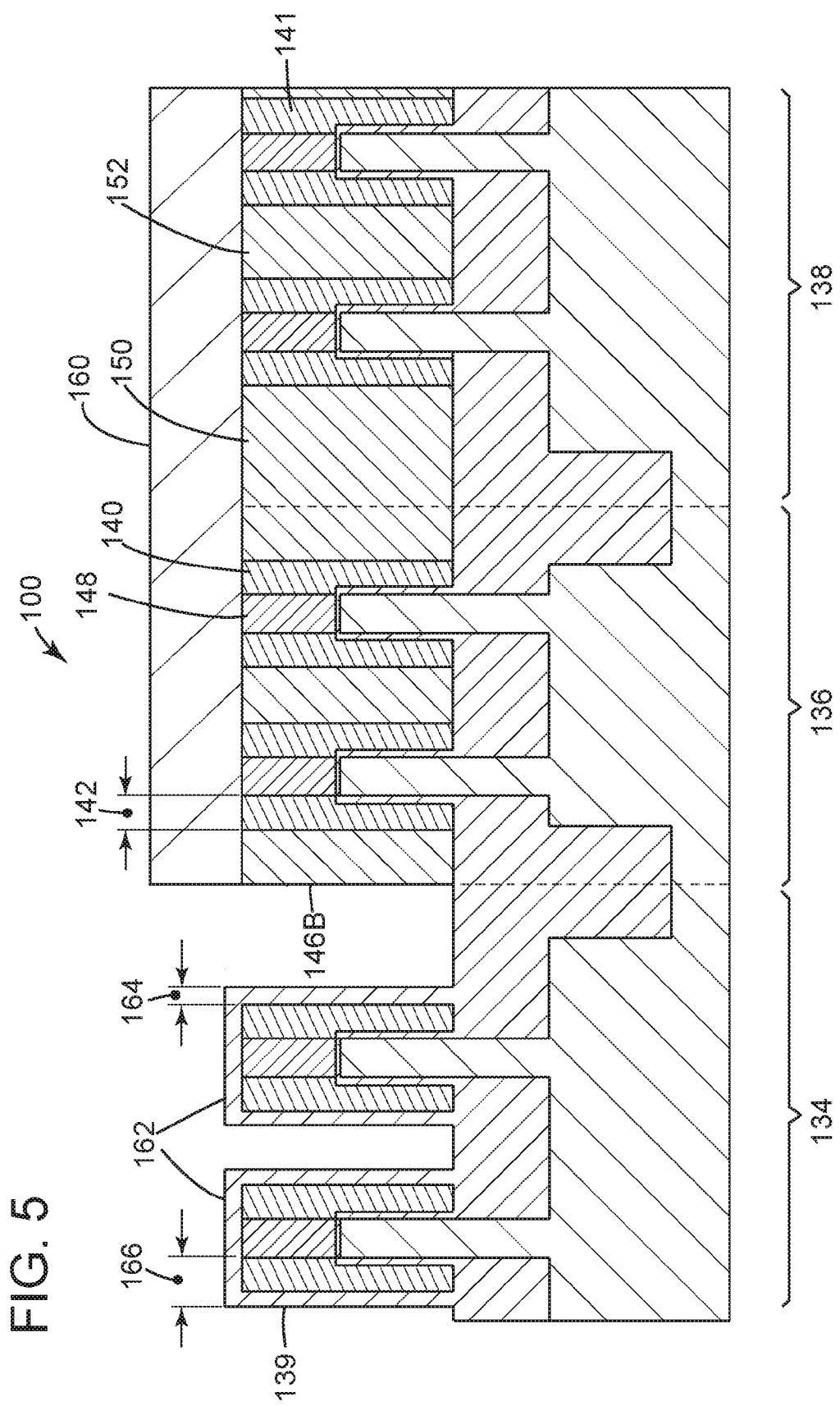
FIG. 5 is a cross-sectional view of FIG. 4 with a blocking layer covering the second and third spacers and the first spacers exposed in accordance with the present invention.

Referring to FIG. 5, next a first blocking layer (or mask) 160 is disposed over the second pillars 146B, 148, 150A and over the third pillars 150B, 152, therefore leaving the first pillars 144, 146A exposed. The blocking layer 160 essentially exposes isolation region 134 and covers both electrically isolated regions 136 and 138, including any structures (or portions of structures such as pillar portions 146B) that overlay regions 136 and 138. The blocking layer 160 may be composed of an amorphous silicon or an amorphous carbine.

The first pillars 144, 146A are then removed to expose only the first spacers 139. The first pillars 144, 146A may be removed with, for example, a wet etching process.

Next the exposed surfaces of the first spacers 139 are thermally oxidized for a predetermined first amount of time to grow a first spacer oxide layer 162, having a first spacer oxide layer thickness 164, over the amorphous silicon first spacers 139. In this way, the growth of the first spacer oxide layer 162 adjusts (in this case, increases) the overall thickness of first spacers 139 from a first spacer thickness 142 to a larger second spacer thickness 166.

The second spacer thickness 166 may be within a range of 0 to 20 percent larger than the first spacer thickness 142. The first spacers 139, now including first spacer oxide layer 162 and having a second spacer thickness of 166, will be ultimately utilized to form WF metal structures 206 in the first electrically isolate region 134 (best seen in FIG. 16).

As will be explained in greater detail herein, WF metal structures 206 will have a width that is substantially equal to the second spacer thickness 166 of the first spacers 139. Also, the widths of WF metal structures 206 will be different from widths of other WF metal structures 208 and 210 in the second 136 and third 138 electrically isolated regions respectively. In this way, the three regions 134, 136, 138 of structure 100 will be formed with different threshold voltages (Vts).

Though this exemplary embodiment illustrates an adjustment of the thickness of first spacers 139 by utilizing a thermal oxidation process to increase the spacer thickness, one skilled in the art would recognize that other techniques can be used to adjust spacer thickness. For example, the spacers 139-141 may be composed of an ultraviolet curable material that changes dimension when exposed to ultra violet energy (e.g., a UV curable nitride). Therefore, the thickness of first spacers 139 may be decreased a predetermined amount by exposing them to ultraviolet energy for a predetermined amount of time. By way of another example, the thickness of the first spacers 139 may be increased by disposing an oxide layer in the spacers through such methods as atomic layer deposition (ALD), rather than thermally oxidizing the first spacers to grow an oxide layer on the exposed surfaces.

Figure 6:
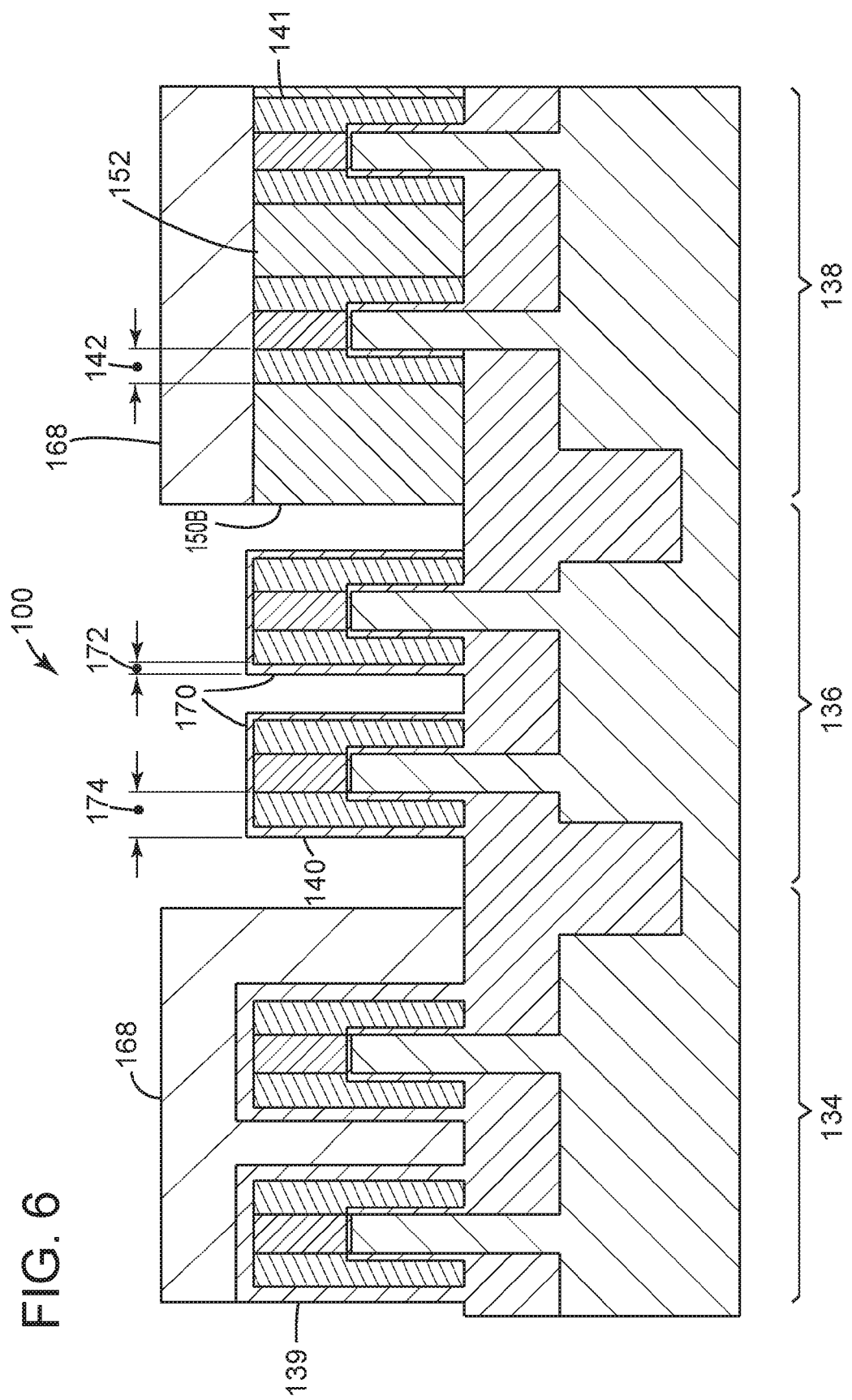
FIG. 6 is a cross-sectional view of FIG. 5 with a blocking layer covering the first and third spacers and the second spacers exposed in accordance with the present invention.

Referring to FIG. 6, next the first blocking mask 160 is stripped away by, for example, a wet etch process. Then a second blocking layer (or mask) 168 is disposed over the first spacers 139 and the third spacers 141, therefore leaving the second spacers 140 exposed. The blocking layer 168 essentially exposes second isolation region 136 and covers both electrically isolated regions 134 and 138, including any structures (or portions of structures such as pillar portions 150B) that overlay regions 134 and 138. The second blocking layer 168 may be composed of the same amorphous silicon or an amorphous carbon as the first blocking layer 160.

The second pillars 146B, 148, 150A are then removed to expose only the second spacers 140. The second pillars 146A, 148, 150A may be removed with, for example, a wet etching process.

Next the exposed surfaces of the second spacers 140 are thermally oxidized for a predetermined second amount of time to grow a second spacer oxide layer 170, having a second spacer oxide layer thickness 172, over the amorphous silicon second spacers 140. In this way, the growth of the second spacer oxide layer 170 adjusts (in this case, increases) the overall thickness of second spacers 140 from a first spacer thickness 142 to a larger third spacer thickness 174.

In this embodiment, the second amount of time to thermally oxidize the surfaces of the second spacers 140 is different from the first amount of time to thermally oxidize the surfaces of the first spacers 139. More specifically, the second amount of time to thermally oxidize the second spacers 140 is less than the first amount of time to thermally oxidize the first spacers 139. Therefore the second oxide layer thickness 172 is less than the first oxide layer thickness 164 and the third overall spacer thickness 174 is less than the second overall spacer thickness 166.

The third spacer thickness 174 may be within a range of 0 to 20 percent larger than the first spacer thickness 142. The second spacers 140, now including the second spacer oxide layer 170 and having a third spacer thickness of 174, will be ultimately utilized to form WF metal structures 208 in the second electrically isolate region 136 (best seen in FIG. 16).

It is also important to note that, at this stage of the process flow, the third spacers 141 have been protected from both thermal oxidation processes by blocking masks 160 and 168. Therefore, the third spacers 141 retain their first spacer thickness 142 due to the fact that no additional oxide layer has been thermally grow on the third spacers to increase their thickness.

As will be explained in greater detail herein, the WF metal structures 208 will have a width that is substantially equal to the third spacer thickness 174 of the second spacers 140 and will be different from widths of other WF metal structures 206 and 210 in the first 134 and third 138 electrically isolated regions respectively. Additionally, the WF metal structures 210 will have a width that is substantially equal to the first spacer thickness 142 of the third spacers 141 and will be different from widths of other WF metal structures 206 and 208 in the first 134 and second 136 electrically isolated regions respectively. In this way, the three regions 134, 136, 138 of structure 100 will be formed with different threshold voltages (Vts).

Figure 7:
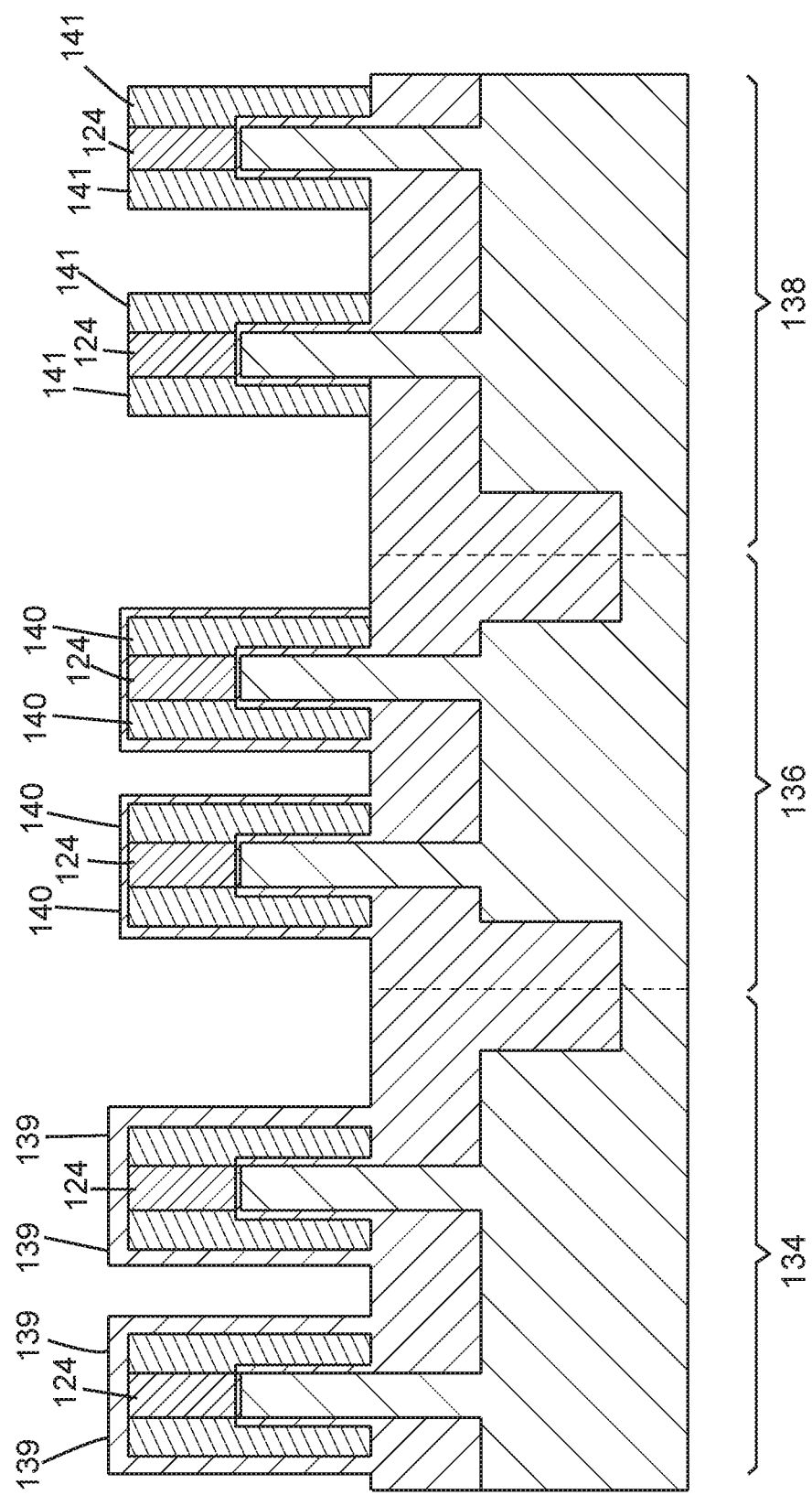
FIG. 7 is a cross-sectional view of FIG. 6 with the blocking layer and all pillars removed to expose the first, second and third spacers in accordance with the present invention.

Referring to FIG. 7, the second blocking layer 168 and third pillars 150B, 152 are removed. The second blocking layer 168 and third pillars 150B, 152 may be removed by several known processes, including, for example, a wet etching process.

At this stage of the process flow, the first, second and third spacers 139, 140, 141 are exposed. The first spacer 139 now has the largest second spacer thickness 166. The second spacer 140 now has the middle spacer thickness 174. The third spacer 141 now has the smallest, original and first spacer thickness 142.

Figure 8:
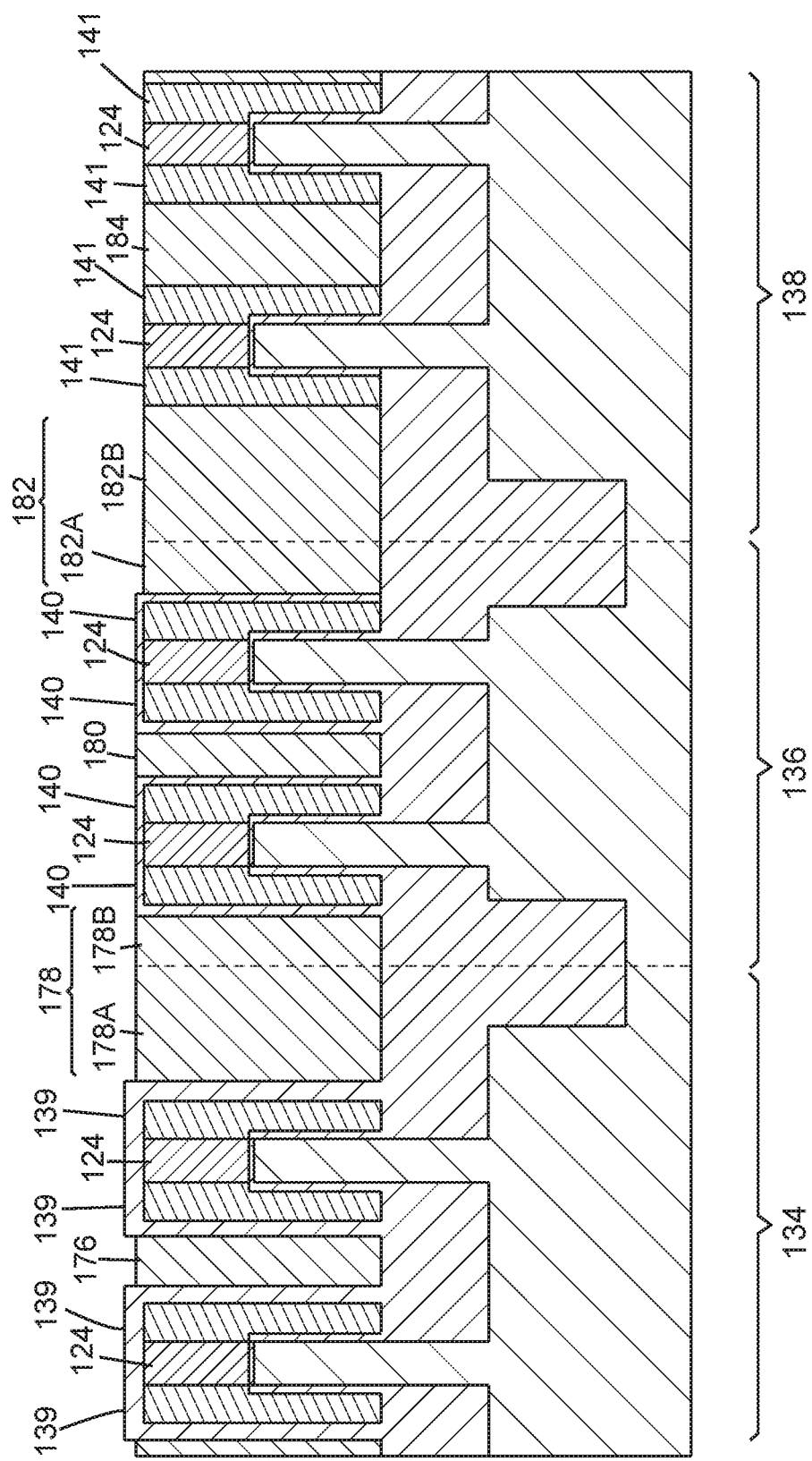
FIG. 8 is a cross-sectional view of FIG. 7 with hardmask supports disposed between and adjacent the spacers in accordance with the present invention.

Referring to FIG. 8, next hardmask supports 176, 178, 180, 182 and 184 (i.e., 176-184) are then disposed between and adjacent the sidewalls of the spacers 139-141. Supports 176-184 are formed by first disposing a second hardmask layer (not shown) of hardmask material over the entire structure 100, including the areas between the spacers 139-141. The second hardmask layer is then planarized down via such processes as chemical-mechanical polishing (CMP) or similar to expose, again, top surfaces of the first hardmask layer 124 and to finalize formation of hardmask supports 176-184.

The supports 176-184 may be formed of a silicon nitride (SiN) or similar. It is important to note that the supports 176-184 must have a different material composition from that of the first hardmask layer 124. This difference in material composition is necessary in order to be able to selectively etch and remove the first hardmask layer 124 later in the process flow without significantly etching the supports 176-184.

The hardmask supports 176-184 overlay all three electrically isolated regions 134, 136 and 138. Those supports that overlay the first region 134 are called, collectively, the "first supports", which herein include support 176 and a portion of support 178 (designated herein as 178A). Those hardmask supports that overlay the second region 136 are called, collectively, the "second supports", which herein include the remaining portion of support 178 (designated herein as 178B), support 180 and a portion of 182 (designated herein as 182A). Those supports that overlay the third region 138 are called, collectively, the "third supports", which herein include the remaining portion of support 182 (designated herein as 182B) and support 184.

Figure 9:
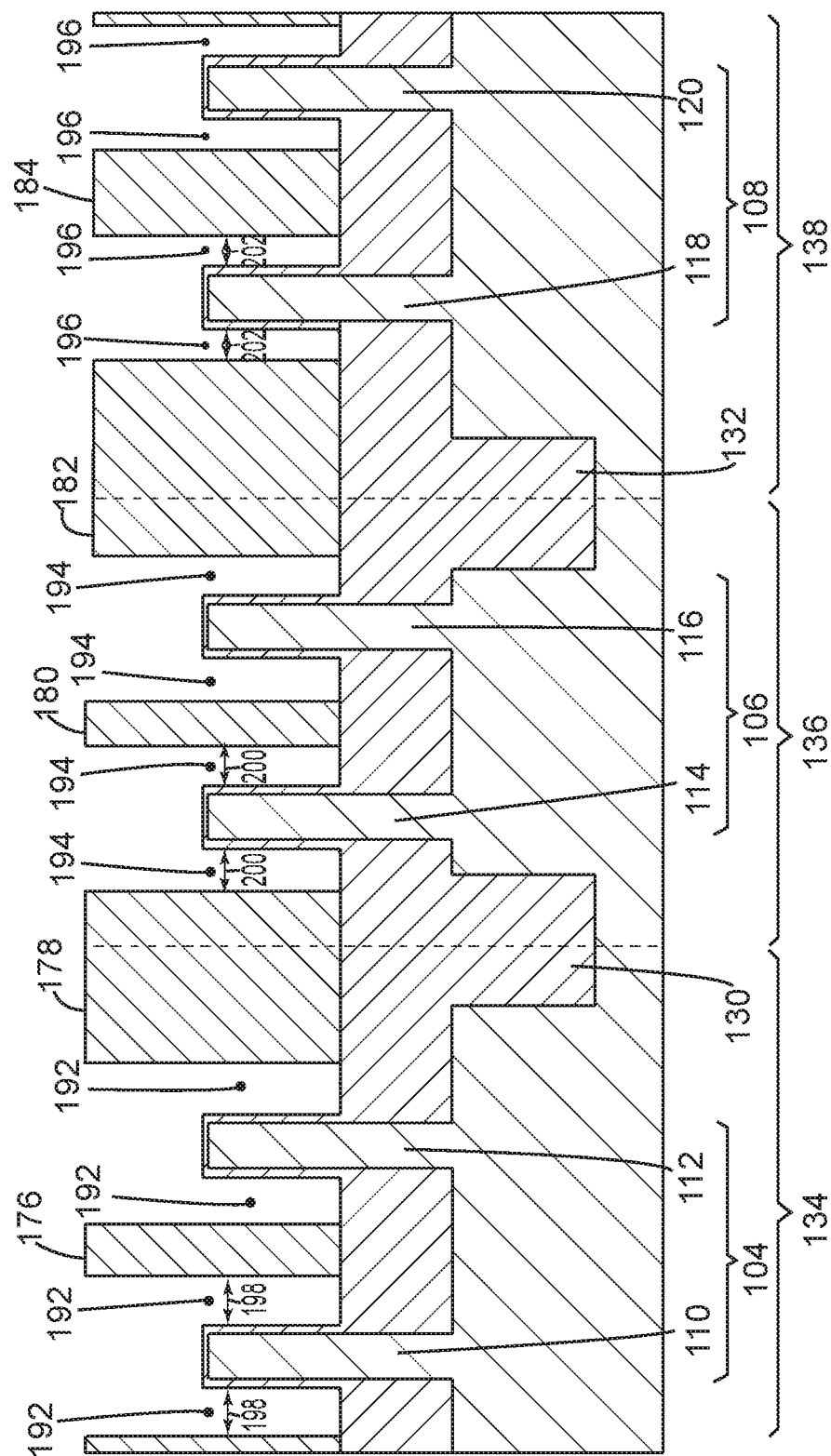
FIG. 9 is a cross-sectional view of FIG. 8 with the spacers removed to form work-function metal trenches in accordance with the present invention.

Referring to FIG. 9, the first hardmask layer 124 and the amorphous spacers 139, 140, 141 are sequentially removed to expose the fins 110-120 and the supports 176-184. The hardmask layer 124 and spacers 139-141 can be removed by such means as wet etching, reactive ion etching (RIE) or similar.

It is important to note that removing the spacers 139, 140, 141 forms WF metal trenches 192, 194, 196, which are defined by the supports 176-184 and fins 110-120. The WF metal trenches 192, 194, 196 may be categorized into first, second and third groups of trenches respectively. The first, second and third groups of trenches are associated with the first, second and third fin arrays 104, 106 and 108 respectively. The first, second and third fin arrays 104, 106 and 108 are each disposed in their associated first, second and third electrically isolated regions 134, 136 and 138 of the structure 100.

First WF metal trenches 192 have a first trench width 198 that was defined by the second spacer thickness 166 of the first spacers 139. The second WF metal trenches 194 have a second trench width 200 that was defined by the third spacer thickness 174 of the second spacer 140. Finally, the third WF metal trenches 196 have a third trench width 202 that was defined by the first spacer thickness 142 of the third spacers. It is important to note that the first trench width 198 is larger than the second trench width 200 and the second trench width 200 is larger than the third trench width. This variation in thickness is due to the thermal oxidation process that adjusted the thickness of spacers 139-141. A typical size of the trench widths 198, 200 and 202 would be 3 to 10 nanometers (nm).

As will be explained in greater detail herein, WF metal structures 206, 208, 210 will be disposed within the WF metal trenches 192, 194, 196 within gates 190 that will extend laterally across fins 110-120 (best seen in FIG. 16). Since each of the WF metal trenches 192, 194, 196 will be utilized in the formation of their associated WF metal structure 206 208, 210, then the WF metal structures will have different thicknesses, which will advantageously provide different Vts in each of the three electrically isolated regions 134, 136 and 138.

Figure 10:
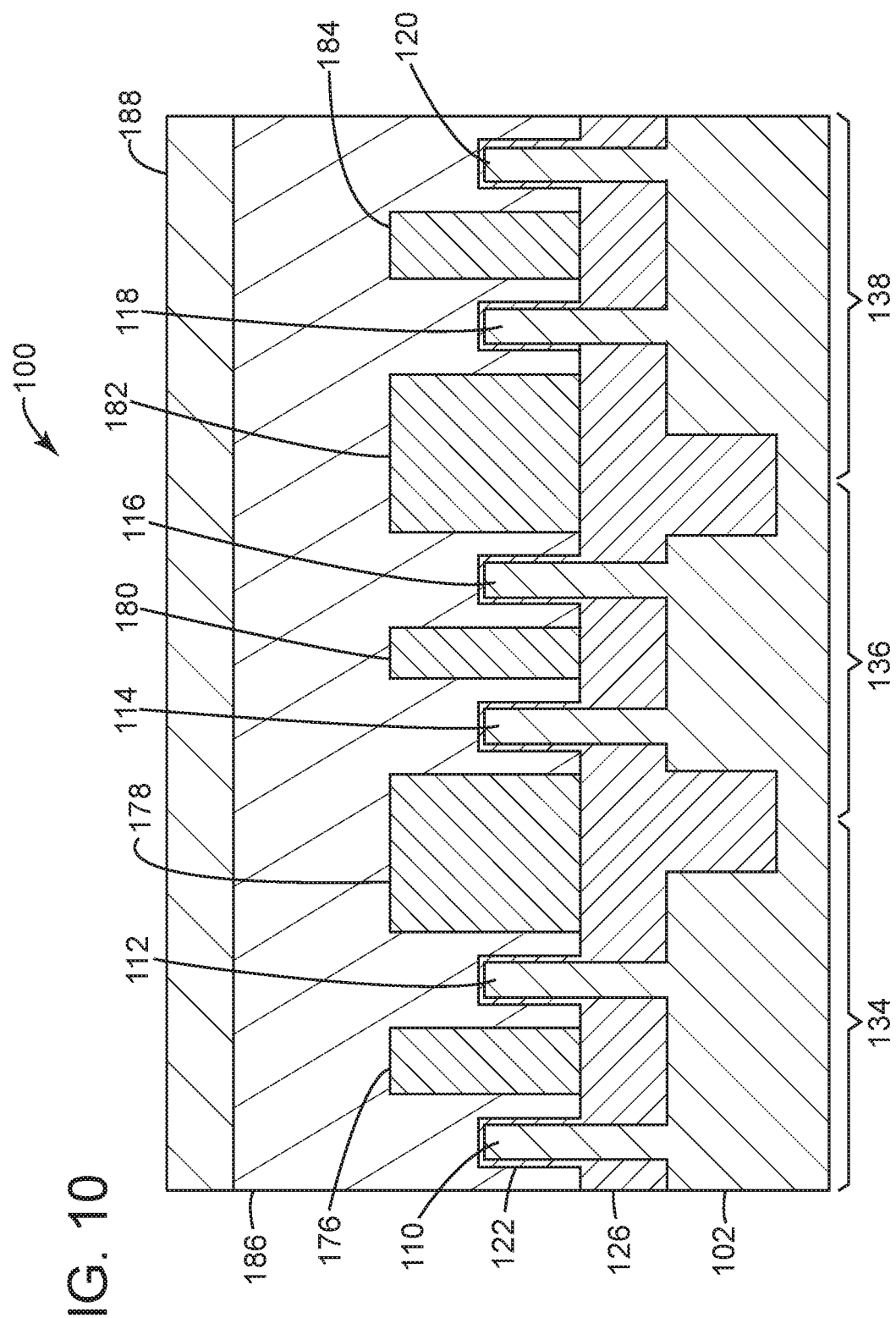
FIG. 10 is a cross-sectional view of FIG. 9 with a dummy gate layer and hardmask layer disposed over the fins and supports in accordance with the present invention.

Referring to FIG. 10, next the formation of gates 190 (best seen on FIG. 11A) is initiated with a layer of poly-silicon dummy gate material 186 being disposed over the structure 100 and a third hardmask layer 188 being disposed over the dummy gate material. The poly-silicon dummy gate material 186 is deposited over structure 100 using well-known processes such as chemical vapor deposition (CVD), physical vapor deposition (PVD) or the like. Following the deposition, dummy gate material 186 can be planarized to facilitate subsequent gate formation steps, using for example chemical-mechanical polishing (CMP).

The third hardmask layer 188 may also be disposed using CVD, PVD or the like. The third hardmask layer 188 is used in subsequent gate formation and may be disposed of silicon nitride (SiN), titanium nitride (TiN) or similar.

Figure 11A:
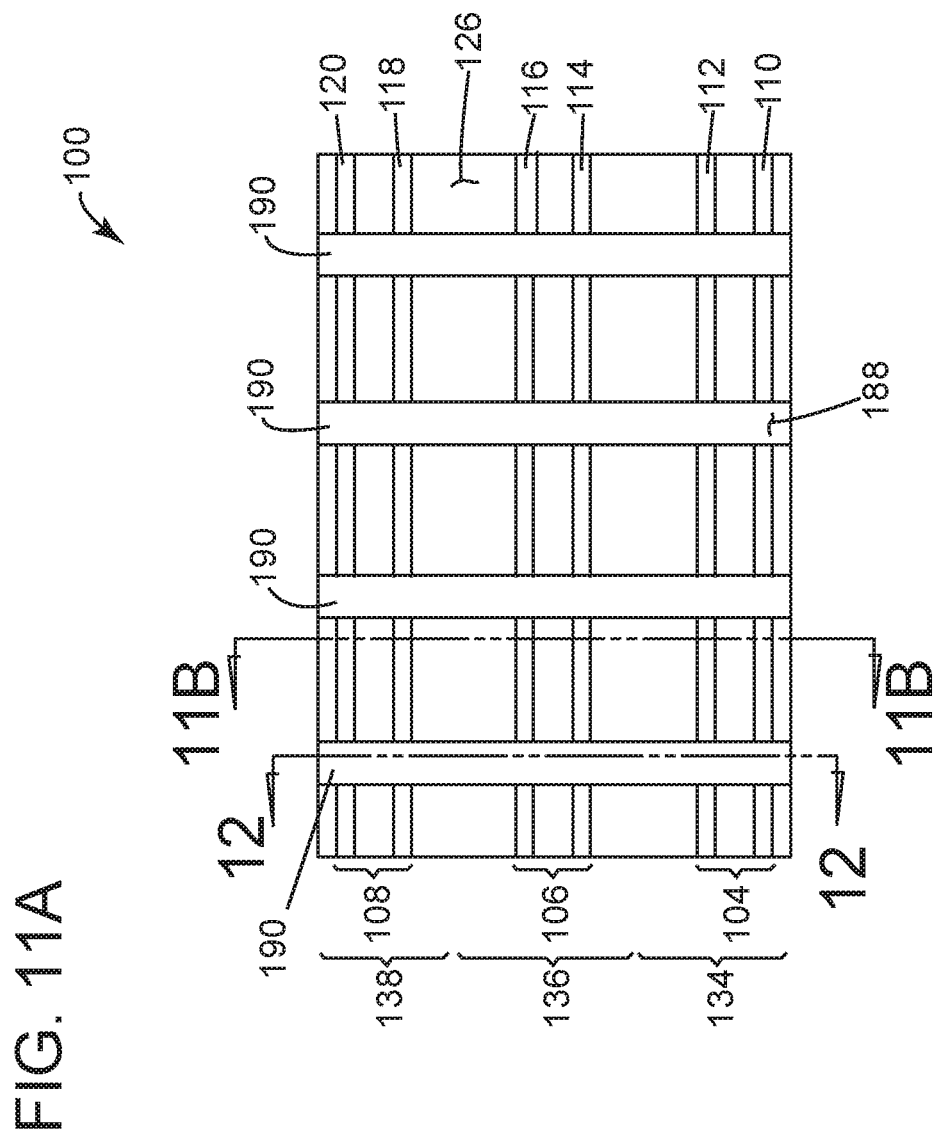
FIG. 11A is a top planar view of the structure of FIG. 10 with gates formed laterally over the fins in accordance with the present invention.
Figure 11B:
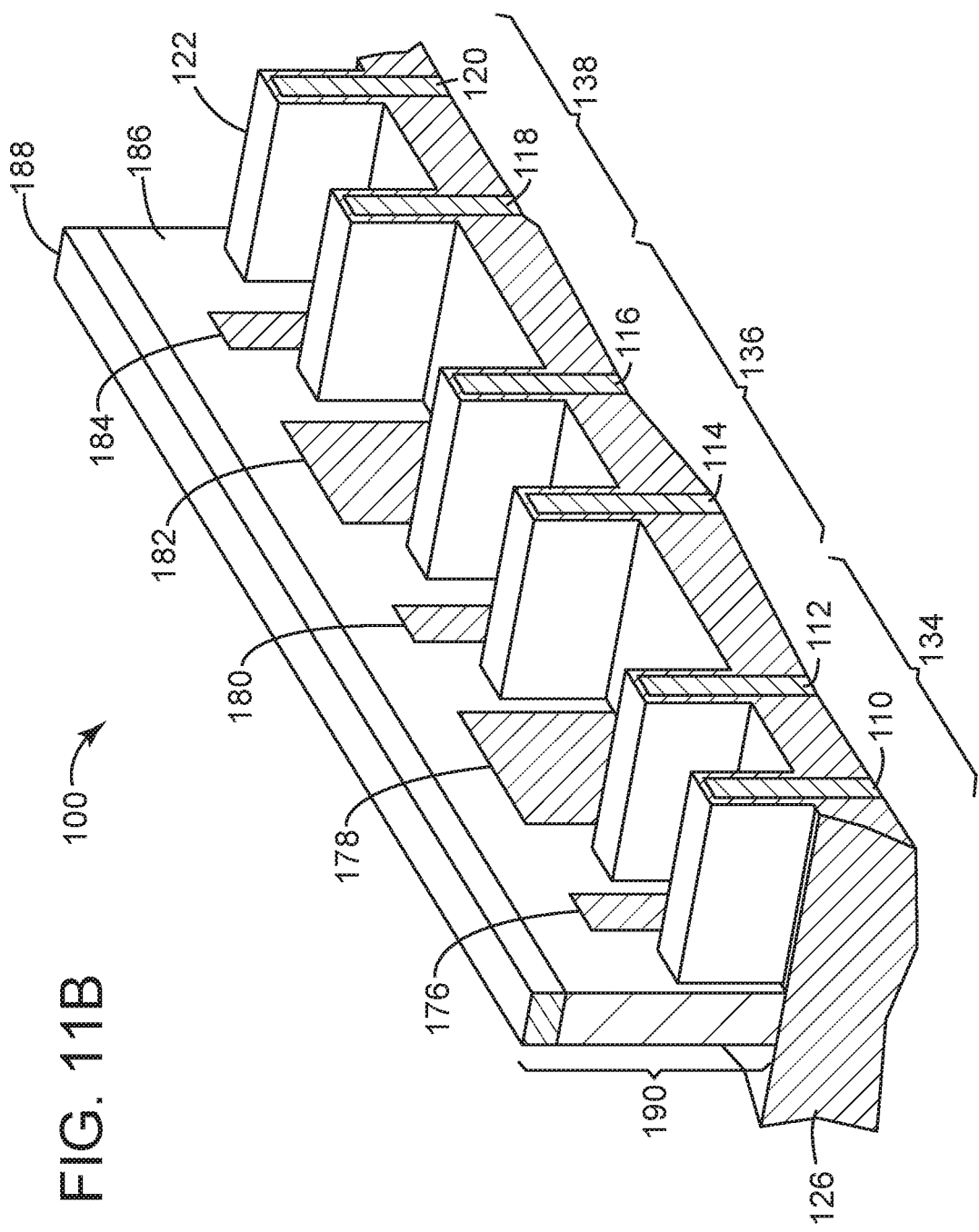
FIG. 11B is a perspective view of FIG. 11A taken along line 11B-11B in accordance with the present invention.

Referring to FIGS. 11A and 11B, an exemplary embodiment of a top planar view and perspective view of the structure 100 after formation of a plurality of dummy gates 190 is presented. Dummy gates 190 are created by etching the polysilicon dummy gate layer 186 of FIG. 10 using well-known processes such as standard lithographic processes and anisotropic dry etching such as reactive ion etching (RIE).

As can be best seen from perspective view FIG. 11B, the supports 176-184 in the areas of structure 100 located between the gates 190 have also been anisotropically etched down, but not the fins 110-120. Later in the process flow, the fins 110-120 will also be anisotropically etched down in the areas between the gates 190 to prepare for epitaxial growth of source/drain regions (not shown).

Additionally at this stage of the process flow, the well-known gate spacers (not shown), which are used to abut and define the outer lateral boundaries of the gates 190, have not yet been formed on the sidewalls of the gates 190. Therefore, the ends of the supports 176-184 within the gates 190 are clearly visible, as the supports extend laterally across the gates and now terminate at the gate's outer lateral boundaries.

Figure 12:
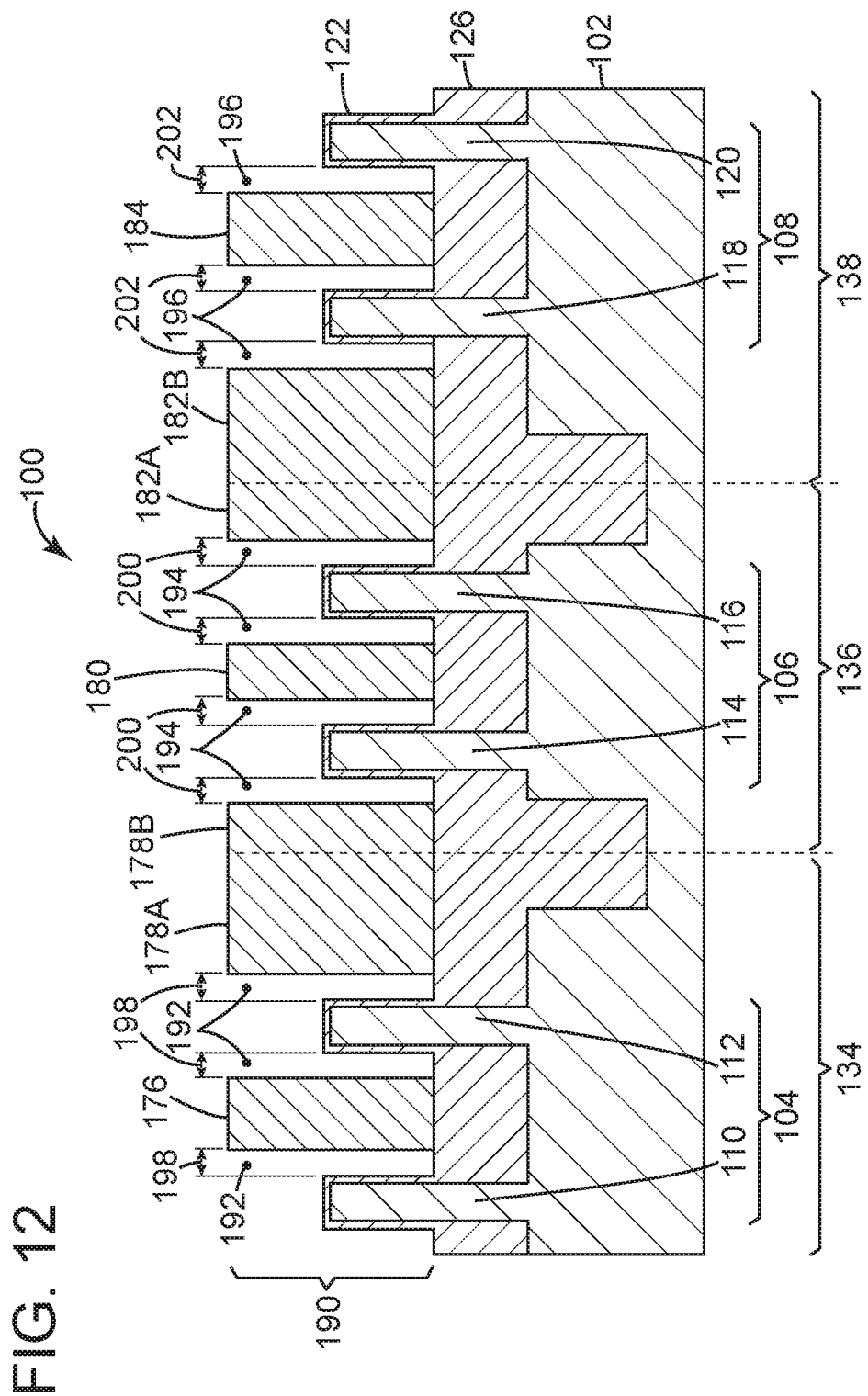
FIG. 12 is a cross-sectional view of FIG. 11A taken along line 12-12 with the dummy gate layer removed from the gates in accordance with the present invention.

Referring to FIG. 12, a cross-sectional side view of a gate 190 taken along the line 12-12 of FIG. 11A is presented. At this stage of the process flow, the gate spacers (not shown) have been formed on the sidewalls of the gates 190 to define the lateral boundaries of the gates. Additionally the third hardmask 188 and the poly-silicon dummy gate material 186 have been removed from the gates 190 to expose the work-function (WF) metal trenches 192, 194 and 196 within the gate 190. The dummy gate material 186 and third hardmask 188 may be removed by a wet etching process, a selective RIE process or similar. The thin protective oxide layer 122 was used to protect the fins 110-120 during the dummy gate material 186 removal process and still remains over the fins 110-120.

Figure 13:
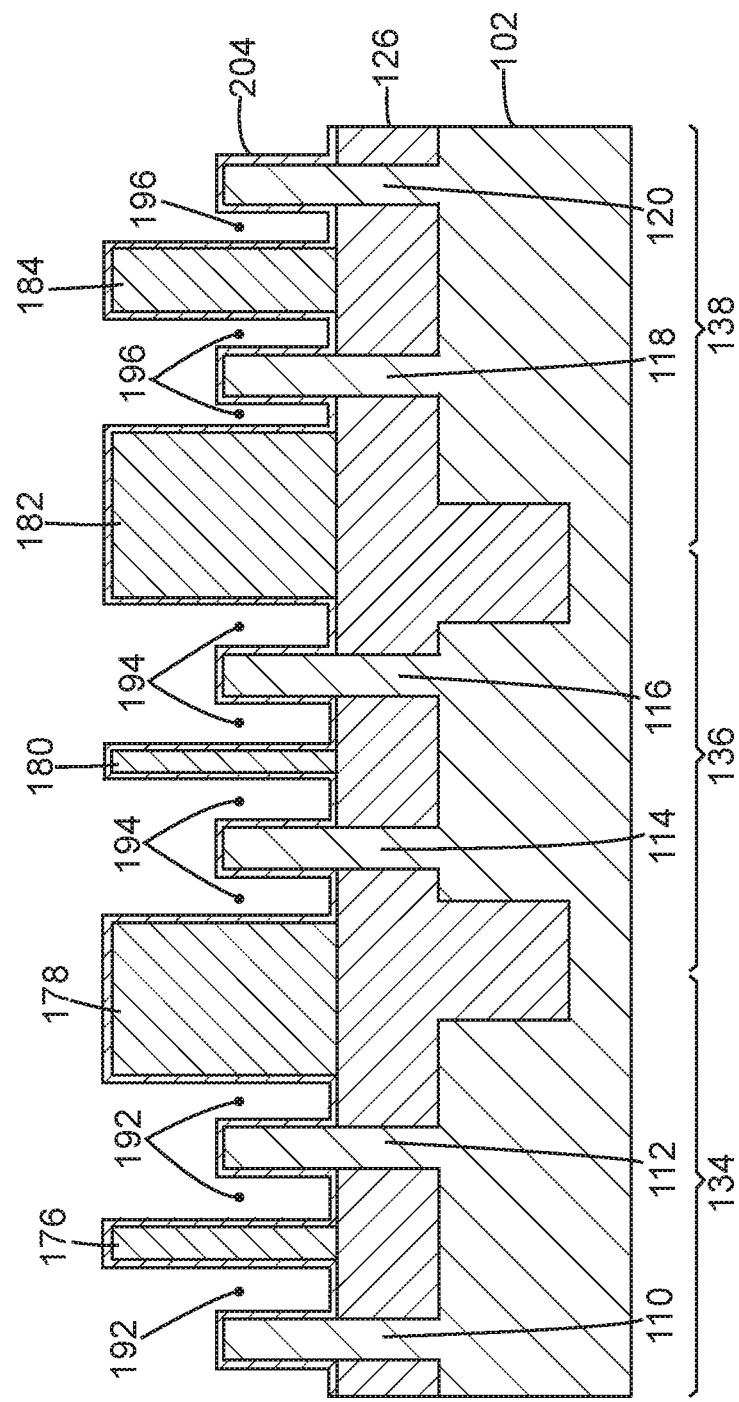
FIG. 13 is a cross-sectional view of FIG. 12 with a gate electrode layer disposed thereon in accordance with the present invention.

Referring to FIG. 13, next the thin oxide layer 122 is removed by such means as wet etching or RIE. The trenches 192, 196, 198 are now cleared for formation of gate stacks for FinFETs.

Gate stacks generally include three main groups of structures. Those three main structures are: the gate dielectric layers (typically a high-k dielectric material), the work-function (WF) metal structures (typically TiN, TaN, TiCAl, other metal-nitrides or similar materials) and the gate electrode metal (typically Al, W, Cu or similar metal). The gate dielectric layers are used to electrically insulate the WF metal structures and the gate electrodes from the substrate. The WF metal structures are generally metal-nitrides that provide the work-function needed for proper FinFET operation, but have a 10 to 100 times larger resistivity than the gate electrodes. The gate electrodes are metals with a very low resistivity.

At the stage of process flow illustrated in FIG. 13, a gate dielectric 204 (typically a high k dielectric such as hafnium oxide (HfO2) with a silicon dioxide (SiO2) interfacial layer or similar) is disposed over the entire structure 100. The gate electrode can be disposed over structure 100 by such means as atomic layer deposition and has a substantially uniform dielectric layer thickness.

Figure 14:
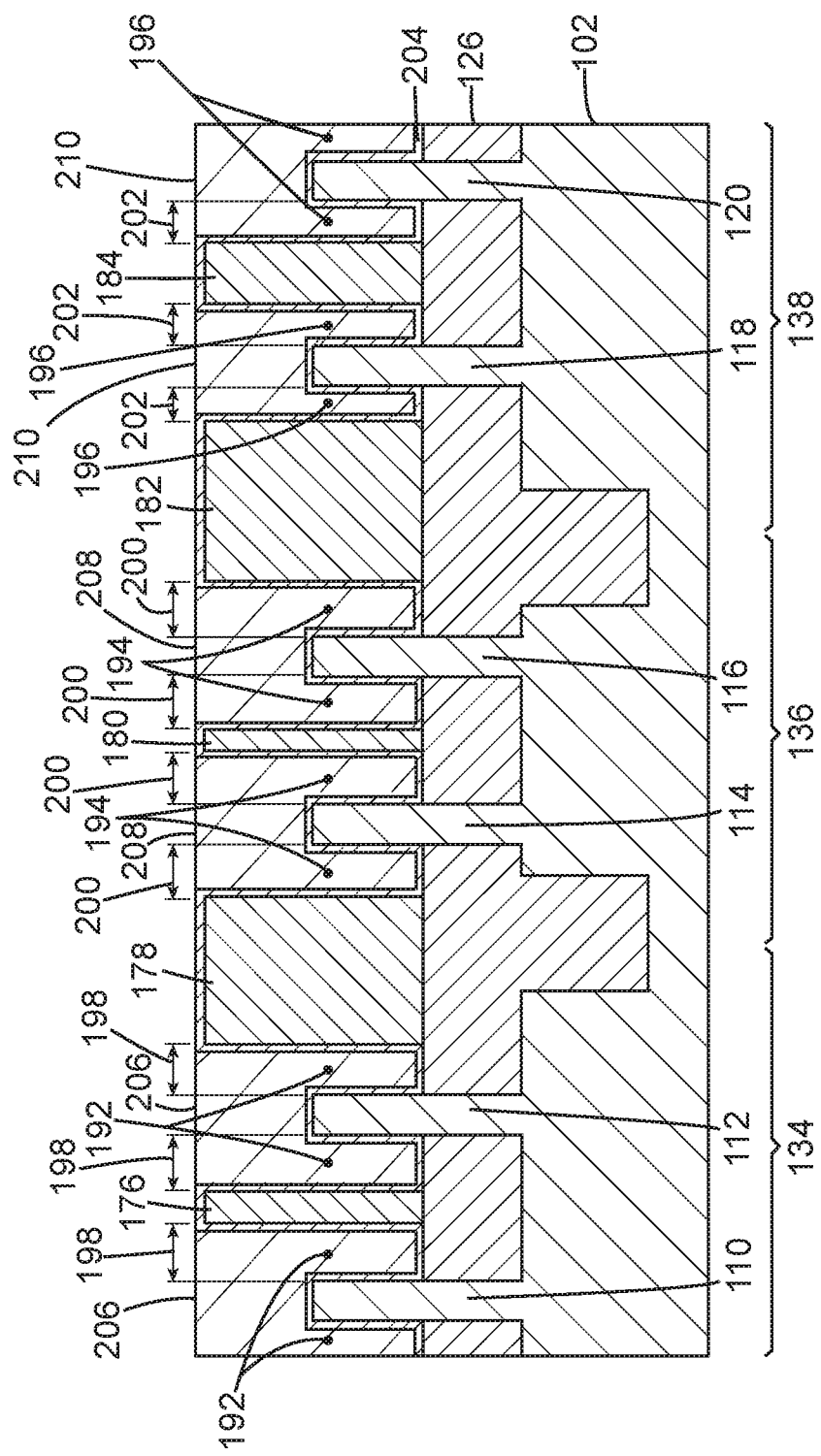
FIG. 14 is a cross-sectional view of FIG. 13 with work-function metal structures disposed between the support and over the fins in accordance with the present invention.

Referring to FIG. 14, first WF metal structures 206, second WF metal structures 208 and third WF metal structures 210 are next disposed within the first, second and third WF metal trenches 192, 194, 196 respectively. The WF metal structures 206, 208, 210 can be disposed within the trenches 192, 194, 196 and over the fins 110-120 by first disposing a WF metal layer (not shown) over the entire structure 100 by such means as CVD. The WF metal layer is then planarized down to expose the tops of the supports 176-184 and to complete the formation of the WF metal structures 206, 208, 210.

It is important to note that within the WF metal trenches 192, 194, 196, the WF metal structures 206, 208, 210 have a thickness substantially equal to the trench width minus the thickness of the gate dielectric 204. More specifically, within the first trench 192, the thickness of first WF metal structure 206 is substantially the first trench width 198 minus the gate dielectric thickness. Within the second trench 194, the thickness of the second WF metal structure 208 is substantially the second trench width 200 minus the same gate dielectric thickness. Also, within the third trench 196, the thickness of the third WF metal structure 210 is substantially the third trench width 202 minus the same gate dielectric thickness.

Since the three trench widths 198, 200, 202 are different, the thickness of the three WF metal structures 206, 208, 210 are also different. Since the threshold voltage (Vt) within a region 134, 136, 138 is dependent on the WF metal structure thickness (especially with small WF metal thicknesses such as in the range of 3-10 nm), then each of the three electrically isolated regions 134, 136 and 138 will advantageously have a different Vt.

Figure 15:
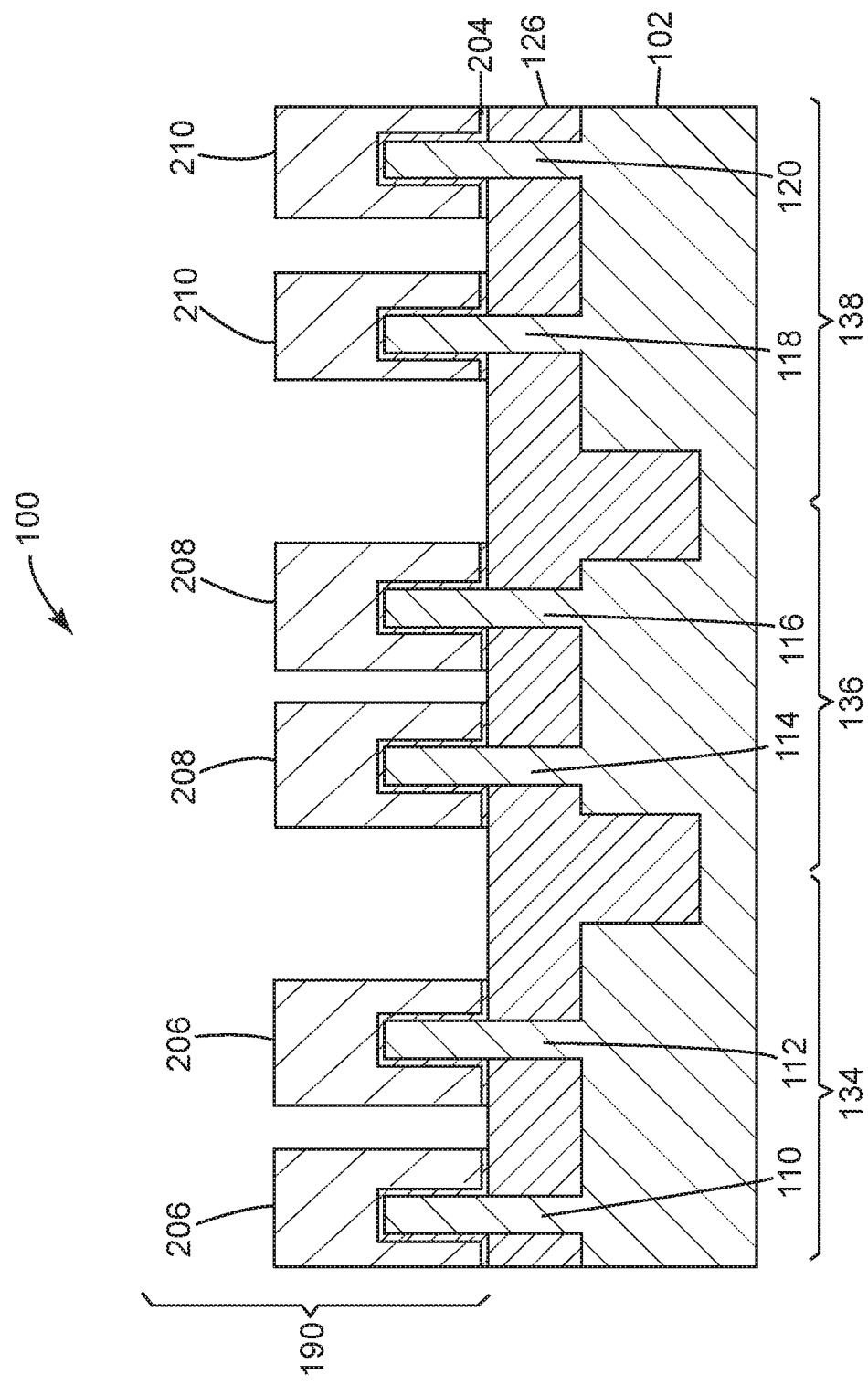
FIG. 15 is a cross-sectional view of FIG. 14 with the supports removed in accordance with the present invention.

Referring to FIG. 15, the supports 176-184 are next removed. The supports 176-184 may be removed by such means as RIE or wet etching. Additionally, that portion of the gate dielectric material 204 that abuts the supports 176-184 is also removed via the same removal processes.

Figure 16:
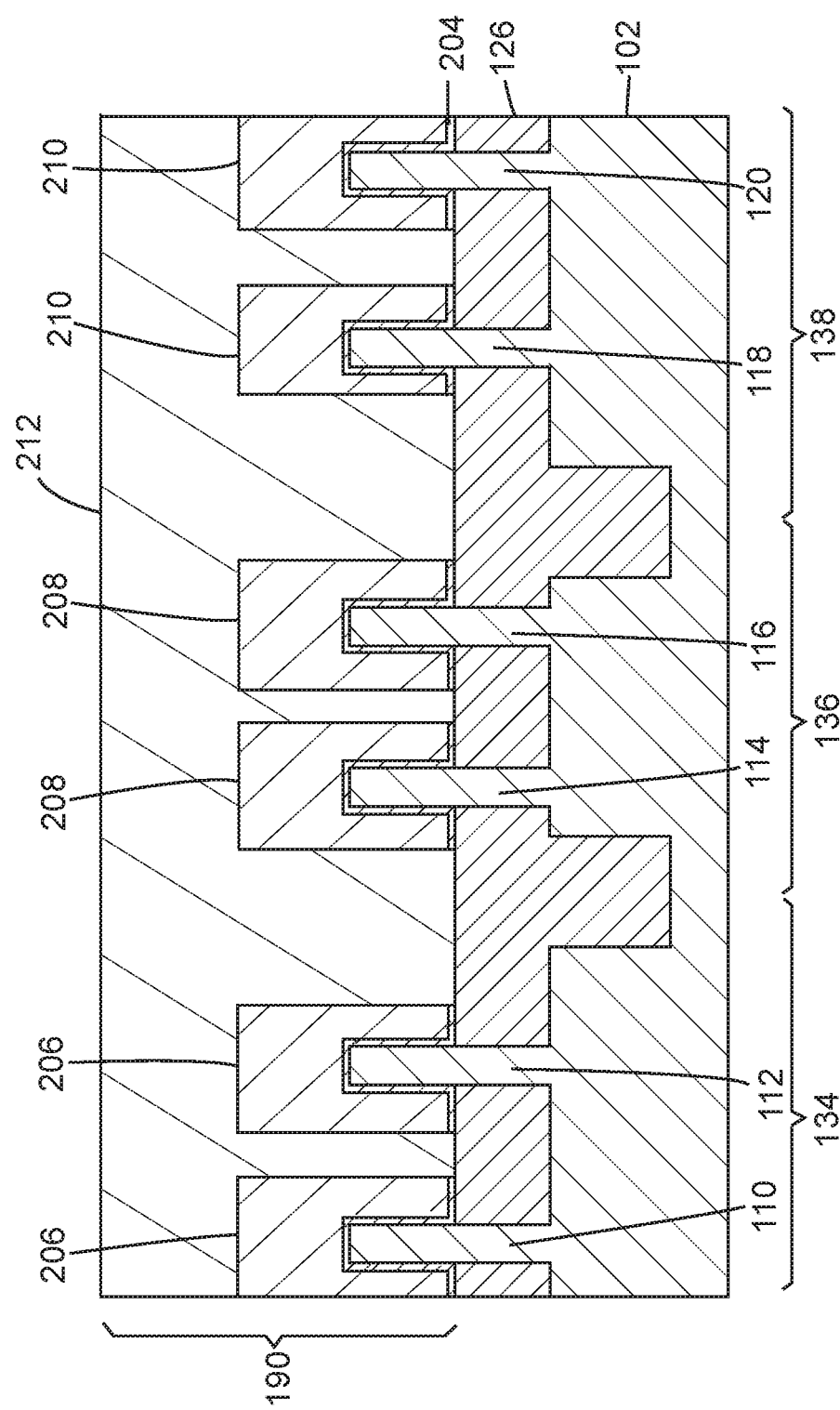
FIG. 16 is a cross-sectional view of FIG. 15 with a gate electrode metal layer disposed thereon in accordance with the present invention.

Referring to FIG. 16, a gate electrode metal layer 212 is next disposed within the gate 190 and over the WF metal structures by well-known methods to complete the gate stack. The electrode metal layer 212 may be composed of Al, Cu, W or similar.

Advantageously, the three regions 134, 136, 138 of structure 100 now have different threshold voltages by virtue of the various thicknesses associated with the three different WF metal structures 206, 208, 210. For example, the first, second and third WF metal structures 206, 208, 210 may be utilized to form first, second and third FinFETs (not shown), respectively, in each of the three electrically isolated regions 134, 136 and 138. Each of the first, second and third FinFETS will have a first, second and third threshold voltage (Vt) that is different from the FinFETs in any of the other regions 134, 136 and 138.

Also advantageously, the various thicknesses of the WF metal structures 206, 208, 210 were attained with a single deposition of WF metal. Therefore, multiple depositions and removals of WF metal onto and off of the gate dielectric 204 were avoided, thus reducing the possibility of damaging the gate dielectric 204.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
   providing a semiconductor structure having a substrate, the substrate including a first array of fins formed thereon;
   forming first spacers having a first spacer thickness on sidewalls of fins of the first array;
   adjusting the thickness of the first spacers to provide a second spacer thickness different from the first spacer thickness;
   forming first supports between and adjacent the first spacers;
   removing the first spacers to form first WF metal trenches defined by the fins of the first array and the first supports;
   forming a gate extending laterally across the fins of the first array; and
   disposing first WF metal structures within the first WF metal trenches within the gate.

2. The method of claim 1 comprising:
   forming a second arrays of fins on the substrate;
   forming second spacers having the first spacer thickness on sidewalls of fins of the second array;
   adjusting the thickness of the second spacers to provide a third spacer thickness different from the first and second spacer thickness;
   forming second supports between and adjacent the second spacers;
   removing the second spacers to form second WF metal trenches defined by the fins of the second array and the second supports;
   forming the gate to extend laterally across the fins of the second array; and
   disposing second WF metal structures within the second WF metal trenches within the gate.

3. The method of claim 1 comprising thermally oxidizing exposed surfaces of the first spacers for a predetermined first amount of time to grow a first spacer oxide layer having a first oxide layer thickness over the first spacers, the first spacer oxide layer adjusting the overall thickness of the first spacers from the first spacers thickness to the second spacer thickness.

4. The method of claim 2 comprising:
thermally oxidizing exposed surfaces of the first spacers for a predetermined first amount of time to grow a first spacer oxide layer having a first spacer oxide layer thickness over the first spacers, the first spacer oxide layer adjusting the overall thickness of the first spacers from the first spacers thickness to the second spacer thickness; and
thermally oxidizing exposed surfaces of the second spacers for a predetermined second amount of time to grow a second spacer oxide layer having a second spacer oxide layer thickness over the second spacers, the second spacer oxide layer adjusting the overall thickness of the second spacers from the first spacer thickness to the third spacer thickness.

5. The method of claim 4 comprising:
disposing first pillars between and adjacent the first spacers;
disposing second pillars between and adjacent the second spacers;
disposing a first blocking layer over the structure to cover the second pillars and leave the first pillars exposed;
removing the first pillars to expose the first spacers; and
thermally oxidizing the first spacers to grow the first spacer oxide layer.

6. The method of claim 5 comprising:
removing the first blocking layer;
disposing a second blocking layer over the structure to cover the first pillars and leave the second pillars exposed;
removing the second pillars to expose the second spacers; and
thermally oxidizing the second spacers to grow the second spacer oxide layer.

7. The method of claim 6 comprising:
removing the second blocking layer to expose the first and second spacers;
disposing a hardmask layer over the structure; and
planarizing the hardmask layer to form the first and second supports.

8. The method of claim 1 wherein the first trench width is within a range of 3 to 10 nanometers.

9. The method of claim 1 wherein the second thickness is within a range of 0 to 20 percent larger than the first spacer thickness.

10. The method of claim 2 wherein the fins of the first array overlay a first electrically isolated region of the substrate and the fins of the second array overlay a second electrically isolated region of the substrate.

11. A method comprising:
providing a structure having a substrate, the substrate including longitudinally extending first and second arrays of fins overlaying first and second electrically isolated regions of the substrate respectively;
forming first and second spacers, each having a substantially equal first spacer thickness, on sidewalls of fins of the first and second arrays respectively;
adjusting the thickness of the first spacers to provide a second spacer thickness different from the first spacer thickness;
forming first and second supports between and adjacent the first and second spacers respectively;
removing the first and second spacers to form first and second WF metal trenches respectively;
forming a gate extending across the fins of the first and second arrays; and
disposing first and second WF metal structures within the first and second WF metal trenches respectively within the gate.

12. The method of claim 11 comprising:
forming first FinFETs utilizing the first WF metal structures, the first FinFETs having a first threshold voltage (Vt); and
forming second FinFETs utilizing the second WF metal structures, the second FinFETs having a second Vt different from the first Vt.

13. The method of claim 11 comprising:
disposing a WF metal layer over the entire structure; and
planarizing down the WF metal layer to form the first and second WF metal structures within the gate.

14. The method of claim 11 comprising:
removing the first spacers to form the first WF metal trenches, the first WF metal trenches defined by the fins of the first array and the first supports; and
removing the second spacers to form the second WF metal trenches, the second WF metal trenches defined by the fins of the second array and the second supports.

15. The method of claim 11 comprising:
disposing first pillars between and adjacent the first spacers;
disposing second pillars between and adjacent the second spacers;
disposing a first blocking layer over the structure to cover the second pillars and leave the first pillars exposed;
removing the first pillars to expose the first spacers; and
thermally oxidizing the first spacers to grow a first spacer oxide layer.

16. The method of claim 15 comprising:
removing the first blocking layer;
disposing a second blocking layer over the structure to cover the first pillars and leave the second pillars exposed;
removing the second pillars to expose the second spacers; and
thermally oxidizing the second spacers to grow a second spacer oxide layer.

17. The method of claim 16 comprising:
thermally oxidizing exposed surfaces of the first spacers for a predetermined first amount of time to grow the first spacer oxide layer, the first spacer oxide layer adjusting the overall thickness of the first spacers from the first spacers thickness to the second spacer thickness; and
thermally oxidizing exposed surfaces of the second spacers for a predetermined second amount of time to grow the second spacer oxide layer, the second spacer oxide layer adjusting the overall thickness of the second spacers from the first spacers thickness to a third spacer thickness, the third spacer thickness being different from the first and second spacer thicknesses.

18. The method of claim 16 comprising:
removing the second blocking layer to expose the first and second spacers;
disposing a hardmask layer over the structure; and
planarizing the hardmask layer to form the first and second supports.

19. The method of claim 11 wherein the first and second trench widths are within a range of 3 to 10 nanometers.

20. The method of claim 11 wherein the second spacer thickness is within a range of 0 to 20 percent larger than the first spacer thickness.

* * * * *